United States Patent [19]

Chonan et al.

[11] Patent Number: 5,217,849
[45] Date of Patent: Jun. 8, 1993

[54] PROCESS FOR MAKING A TWO-LAYER FILM CARRIER

[75] Inventors: Takeshi Chonan; Yoshihiro Hirota; Yuko Kudo, all of Ichikawa, Japan

[73] Assignee: Sumitomo Metal Mining Company Limited, Tokyo, Japan

[21] Appl. No.: 837,104

[22] Filed: Feb. 18, 1992

Related U.S. Application Data

[63] Continuation of Ser. No. 573,809, Aug. 28, 1990, abandoned.

[30] Foreign Application Priority Data

Aug. 28, 1989 [JP] Japan .................. 1-218723

[51] Int. Cl.⁵ .................. G03F 7/36; C23F 1/02; B44C 1/22
[52] U.S. Cl. .................. 430/314; 430/313; 430/316; 430/317; 430/318; 156/643; 156/646; 156/652; 156/659.1; 156/661.1
[58] Field of Search .................. 430/312, 313, 314, 316, 430/317, 318; 156/643, 646, 652, 659.1, 661.1, 668

[56] References Cited

U.S. PATENT DOCUMENTS

| | | | |
|---|---|---|---|
| 4,259,436 | 3/1981 | Tabuchi et al. | 430/312 |
| 4,353,778 | 10/1982 | Fineman et al. | 430/316 |
| 4,911,786 | 3/1990 | Kindl et al. | 430/318 |

Primary Examiner—Marion E. McCamish
Assistant Examiner—Kathleen Duda
Attorney, Agent, or Firm—Watson, Cole, Grindle & Watson

[57] ABSTRACT

A two-layer film carrier for TAB is made from a substrate prepared by forming a copper layer on a polyimide film by additive plating. A photoresist layer is formed on the copper layer, and another photoresist layer on the polyimide film. Both of the photoresist layers are simultaneously exposed to light through a mask applied to each of them to define a desired pattern. The exposed portions of the photoresist layer on the copper layer are subjected to development and postbaking, whereby selected portions of the copper layer are exposed. The exposed portions of the copper layer are additive plated with copper, whereby leads are formed. The exposed portions of the photoresist layer on the polyimide film are subjected to development and postbaking, whereby selected portions of the polyimide film are exposed. The remaining portions of the photoresist layer are removed from the copper layer and the underlying copper layer is etched. The exposed portions of the polyimide film are etched, and the remaining portions of the photoresist layer are removed from the polyimide film.

6 Claims, 2 Drawing Sheets

5,217,849

PROCESS FOR MAKING A TWO-LAYER FILM CARRIER

BACKGROUND OF THE INVENTION

1. Field of the Invention

This invention relates to a process for making a two-layer film carrier for TAB.

2. Description of the Prior Art

Although wire bonding has hitherto been used for interconnecting the component parts of an IC package, tape automated bonding (TAB) is now considered to be a better method when interconnections for making a multi-pinned type IC. There are three types of film carriers known for TAB. (1) Firstly, there is a one-layer film carrier formed from a single metal, such as copper or aluminum. This type of film carrier can be made at a low cost, but as a base material having a given thickness is worked on directly, it is difficult to make a finely and accurately worked product. This type of film carrier does not lend itself for use in interconnecting the parts of a multi-pinned IC, but has only a limited scope of application. (2) Secondly, there is a three-layer film carrier composed of a copper foil, a polyimide film and an adhesive by which the copper foil is bonded to the polyimide film. The use of the adhesive, however, spoils the benefits of use of the polyimide having high heat resistance and insulating property. Moreover, the manufacture of this type of film carrier has an economical disadvantage, as it requires an expensive punching tool for making sprocket and device holes. (3) Thirdly, there is a two-layer film carrier comprising a substrate which consists of a polyimide film and a metal layer formed on a surface of the polyimide film. This type of film carrier has been proposed as an improvement over the two types of film carriers as hereinabove described, and is claimed to enable the interconnections for a multi-pinned IC.

Although no details are known regarding any specific process that is used for making a two-layer film carrier, it is assumed that a process including the following steps is generally employed:

(a) Forming a photoresist coating having an appropriate thickness on a copper surface;

(b) Exposing the photoresist to light through a mask defining a desired pattern;

(c) Developing the exposed photoresist to expose the copper surface in the desired pattern;

(d) Forming a copper layer by additive plating;

(e) Dissolving and removing the remaining photoresist and removing the copper layer by flush etching;

(f) Applying a photoresist onto both sides;

(g) Exposing the photoresist on a polyimide film to light in a desired pattern;

(h) Developing the exposed photoresist to expose the selected portions of the polyimide film;

(i) Etching the exposed portions of the polyimide film;

(j) Removing the remaining photoresist from the polyimide film; and (k) Forming a plated layer of gold or tin, if required.

This process is, however, considered to have a number of problems as will hereinafter be pointed out:

(1) As the polyimide film remains exposed to the plating solution, etc., for a long time throughout the steps (d) and (e), its property of being wetted with the photoresist becomes so low that the photoresist applied to it during step (f) is likely to peel off at any time thereafter;

(2) As the step (g) of exposure to light comes after the formation of leads, the unevenness of the surface on which the leads have been formed causes the scattering of light, resulting in a lower degree of resolution; and (3) As the photoresists on the copper and the polyimide film are separately exposed to light, the accurate positioning of the patterns on both sides is difficult to achieve, and the operation is inefficient and is difficult to perform continuously.

These problems allow the process to produce only a two-layer film carrier which is expensive, and yet which cannot satisfactorily be used for interconnecting the parts of an IC package having a multi-pinned layer.

SUMMARY OF THE INVENTION

Under these circumstances, it is an object of this invention to provide a process which can make an inexpensive two-layer film carrier which can satisfactorily be used for interconnecting the parts of an IC package having a multi-pinned layer.

This object is attained by a process for making a two-layer film carrier from a substrate prepared by forming a copper layer on a polyimide film by additive plating, the process comprising the steps of:

(1) forming a photoresist layer having an appropriate thickness on one surface of the substrate, and likewise a photoresist layer having an appropriate thickness on the other surface thereof;

(2) exposing the photoresist layers on both of the surfaces simultaneously to light through a mask applied to each surface to define a desired pattern;

(3) subjecting the exposed photoresist layer on the copper layer to development to expose selected portions of the copper layer;

(4) additive plating the exposed portions of the copper layer with copper to form leads;

(5) subjecting the exposed photoresist layer on the polyimide film to development and postbaking to expose selected portions of the polyimide film;

(6) removing the remaining photoresist layer from the copper layer and etching the underlying copper layer;

(7) etching the exposed portions of the polyimide film; and (8) removing the remaining photoresist layer from the polyimide film.

The photoresist layer formed on one surface of the substrate, or the copper layer, is preferably one having a thickness of at least 30 microns and is formed by covering it with an alkali-developable negative photoresist solution having a viscosity of at least 40 cp and a solid content of at least 20%, and the photoresist layer on the other surface of the substrate, or the polyimide film, preferably has a thickness of 2 to 10 microns (step (1)). The postbaking of the developed photoresist on the copper layer (step (3)) is, if necessary, carried out by heating at a temperature of lower than 130° C. for a period of 10 to 90 minutes.

It is sometimes desirable or necessary that the copper layer formed on the polyimide film by additive plating be further electroplated with copper. It may also be desirable or necessary that the surfaces of the leads be finished by plating.

According to the process of this invention, the photoresist layers on both surfaces of the substrate are simultaneously exposed to light, and after a desired pattern has been formed, the copper layer on one surface of the substrate is first etched. Therefore, it enables the manufacture of a very accurately processed two-layer film carrier which can be used effectively during the manufacture of a multi-pinned IC package. Moreover, the process can be carried out continuously and thereby make a two-layer film carrier at a low cost.

Other features and advantages of this invention will become apparent from the following description and the accompanying drawings.

DETAILED DESCRIPTION OF THE INVENTION

Figure 1A:
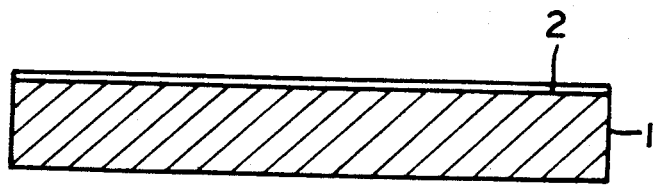
FIGS. 1-A to 1-H are a series of elevational and sectional views showing the various steps of a process embodying this invention.

The process of this invention is used for making a two-layer film carrier from a substrate comprising a polyimide film and a copper layer formed thereon either by additive plating, or by additive plating and electroplating following it. The process is also applicable to a substrate comprising a polyimide film and a layer of another metal, such as nickel, chromium or silver, which has been formed thereon in a similar way.

It is necessary to control appropriately the characteristic impedances of an IC including the interconnections in order to increase the speed of signal transmission to and from it. In this connection, and also in view of the technical limitation to the interconnections, it is important to achieve an appropriate conductor thickness. This thickness is in the range of 30 to 50 microns. Therefore, it is advisable to form a photoresist layer having a thickness of at least 30 microns on the copper side of the substrate. Any material can be used if it can form a layer having such a thickness. It is, however, likely that a photoresist in the form of a solution may be preferred, as it is easy to handle or use. In such an event, it is desirable to use an alkali-developable negative photoresist solution having a viscosity of at least 40 cp and a solid content of at least 20%.

Any photoresist material can be used for covering the polyimide film to form device and sprocket holes if it has the property of resisting the substance used for etching the polyimide film. A material of the rubber series can, for example, be used. The photoresist layer formed on the polyimide film preferably has a thickness of 2 to 10 microns. Pinholes or other defects are likely to appear in any layer having a smaller thickness, while a layer having a larger thickness may allow only patterning with low accuracy.

A bar coater can, for example, be used for applying a photoresist solution to the copper layer, or polyimide film, though any other appropriate device or method can also be employed. The photoresist which has been applied to each side of the substrate is prebaked. The conditions for such prebaking are known in the art and do not, therefore, form a part of this invention.

The photoresist layers on both sides of the substrate are appropriately masked and are simultaneously exposed to light. The simultaneous exposure enables the achievement of a high level of positioning accuracy in patterning on either side and an improved operating efficiency, and contributes to permitting the process to be carried out continuously.

The exposed photoresist on the copper layer is subjected to development before that on the polyimide film is. After development, the photoresist is postbaked. Its postbaking is not essential, but is preferable to promote its drying and improve its adhesion to the substrate. The postbaking of the photoresist on the copper layer is preferably carried out by heating at a temperature of 100° C. to 130° C. for a period of 10 to 90 minutes, so that it may not exert any adverse effect on the photoresist on the polyimide film. The use of a higher temperature and a longer time would result in the failure of the photoresist on the polyimide film to be satisfactorily developed, while the use of a lower temperature and a shorter time would fail to produce any satisfactory result of postbaking in the photoresist on the copper layer.

After development and postbaking, leads are formed by the additive plating of the exposed portions of the copper layer with copper. The additive plating may be either semi-additive or full-additive.

The photoresist on the polyimide film which has been exposed to light is, then, subjected to development and postbaking. The remaining photoresist is removed from the copper layer and the underlying copper layer is etched. Then, the exposed portions of the polyimide film are etched and the remaining photoresist is removed from the polyimide film. The etching of the copper layer is done before that of the polyimide film, as it does not exert any adverse effect on the polyimide film. Finally, the surfaces of the leads may or may not be finished by plating.

The conditions for the postbaking of the photoresist on the polyimide film, the removal of the photoresist from the copper layer, the etching of the copper layer or the polyimide film, etc., are not particularly specified herein, as they are all known in the art.

The invention will now be described more specifically with reference to a few examples thereof.

EXAMPLE 1

A two-layer film carrier was made by a process embodying this invention as shown in FIG. 1A to 1H. The process was applied to a substrate comprising a polyimide film 1 having a thickness of 50 microns (a product of Dupont-Toray Co., Ltd. sold under the name "Kapton") and a copper layer 2 formed on one surface of the polyimide film by sputtering and having a thickness of one micron (FIG. 1A).

Figure 1B:
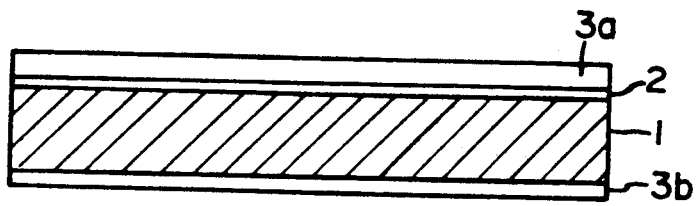

An alkali-developable negative photoresist solution having a viscosity of at least 40 cp and a solid content of at least 20% was applied by a bar coater onto the surface of the copper layer 2 and was prebaked at 70° C. for 30 minutes to form a prebaked photoresist layer 3a having a thickness of about 45 microns (FIG. 1B). Similarly, a negative photoresist solution was applied by a bar coater onto the surface of the polyimide film 1 and was prebaked at 70° C. for 30 minutes to form a prebaked photoresist layer 3b having a thickness of about five microns (FIG. 1B).

Figure 1C:
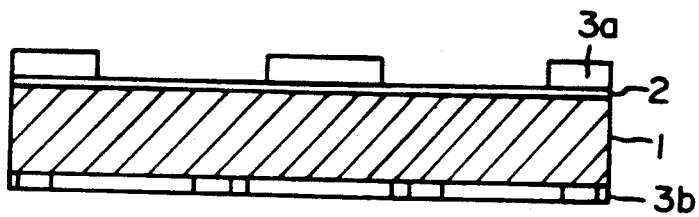

The photoresist layers 3a and 3b on both sides of the substrate were simultaneously exposed to light through a mask applied to each side in accordance with a selected pattern. The exposed portions of the photoresist 3a on the copper layer 2 were subjected to development, and postbaked at 110° C. for 30 minutes, whereby selected portions of the copper layer 2 were exposed (FIG. 1C). The exposed portions of the copper layer 2 were electroplated with copper at a current density of 2

Figure 1D:
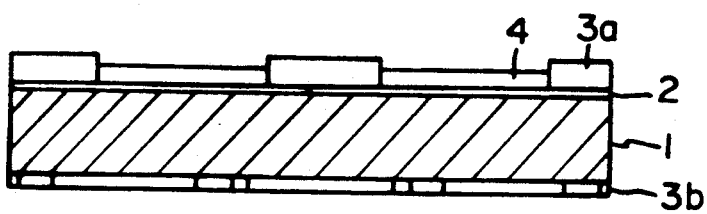

A/dm² for a period of 50 minutes, whereby leads having a thickness of about 35 microns were formed as shown at 4 (FIG. 1D).

Figure 1E:
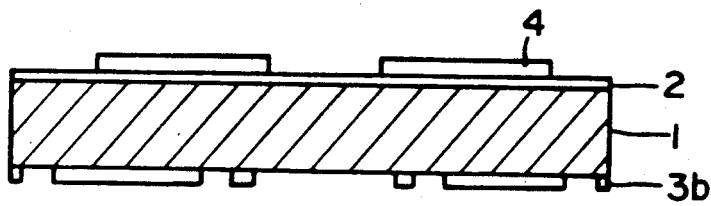
Figure 1F:
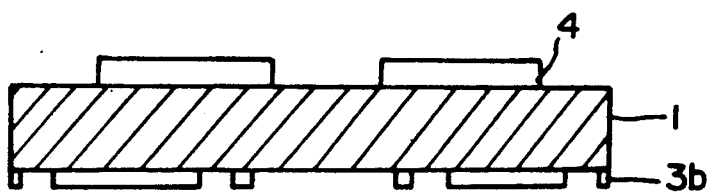

Those portions of the photoresist 3b on the polyimide film 1 which had been exposed to light were subjected to development, and postbaked at 130° C. for 30 minutes, and the substrate was dipped in a 4% NaOH solution having a temperature of 60° C. and left to stand for one minute, whereby the remaining photoresist 3a was removed from the copper layer 2 (FIG. 1E). Then, it was dipped in a cuprous chloride solution having a temperature of 50° C. and left to stand for 30 seconds, whereby the underlying copper layer 2 was dissolved away (FIG. 1F).

Figure 1G:
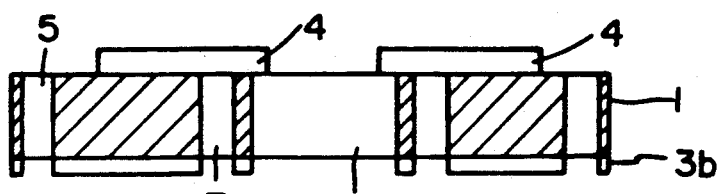

The substrate was, then, dipped in an etching solution prepared by mixing hydrazine hydrate and ethylenediamine in a ratio by volume of 8:2, and having a temperature of 50° C., and was left to stand for five minutes, whereby various holes 5 to 7 (sprocket, device and outer lead holes) were formed through the polyimide film 1 (FIG. 1G). Then, the remaining photoresist 3b was removed from the polyimide film 1 by using a solvent containing 20% by volume of each of chlorobenzene and tetrachloroethylene.

Figure 1H:
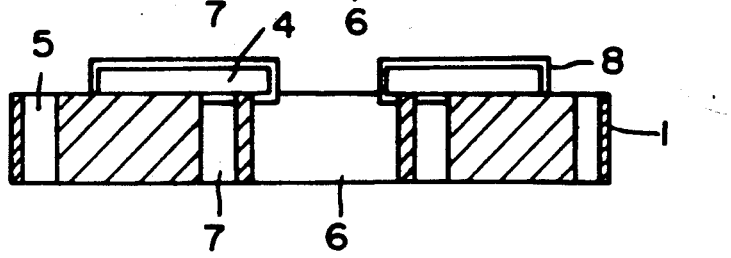

Finally, the lead surfaces were given a finish 8 by three minutes of gold plating at a current density of 1 A/dm², whereby there was obtained a two-layer film carrier having a lead width of 70 microns and a space width of 60 microns (FIG. 1H).

EXAMPLE 2

A two-layer film carrier was made by repeating the process of EXAMPLE 1, except that the substrate consisted of a polyimide film having a thickness of 50 microns ("Kapton" of Dupont-Toray Co., Ltd.) and a copper layer consisting of a layer formed on the polyimide film by electroless plating and having a thickness of 0.25 micron and a layer formed on the electrolessly plated layer by electroplating and having a thickness of one micron, and that the copper layer was coated with the negative photoresist solution sold by Tokyo Ohka Kogyo Kabushiki Kaisha under the designation "PMER HC 600", and the polyimide film with the negative photoresist sold by Fuji Yakuhin Kogyo Kabushiki Kaisha under the designation "FSR".

Figure 2:
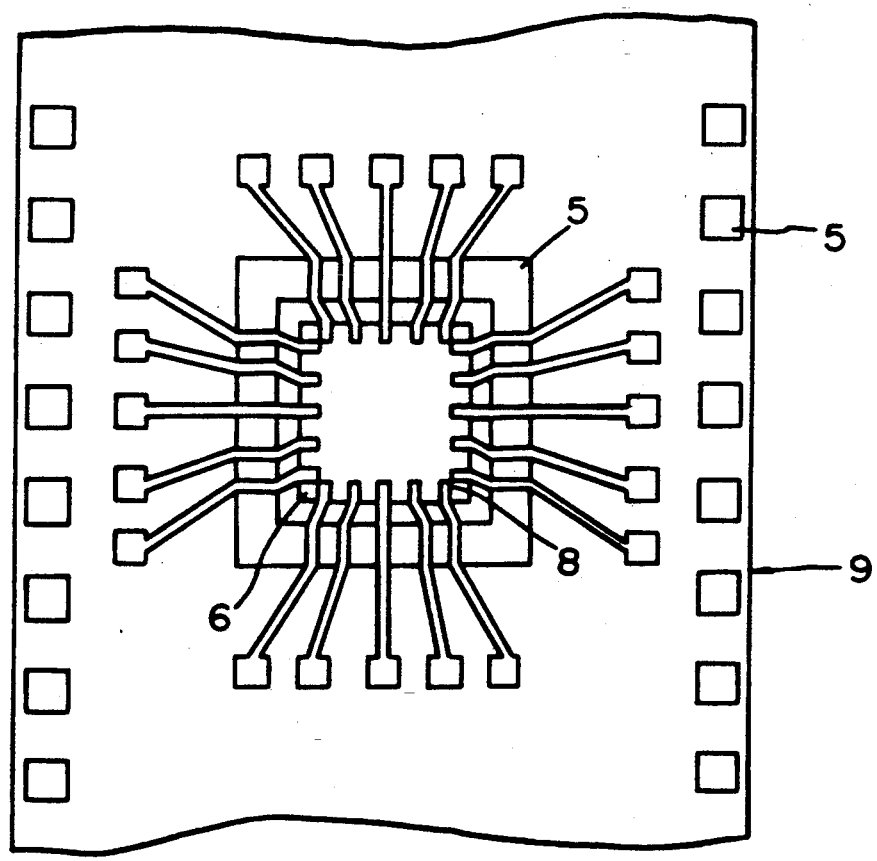
FIG. 2 is a top plan view of a two-layer film carrier made by way of example in accordance with the process of this invention.

It was similar to the product of EXAMPLE 1 and its top plan was as shown in FIG. 2, in which the two-layer film carrier is shown at 9, its sprocket holes at 5, its device hole at 6, and its inner leads at 8.

What is claimed is:

1. A process for making a two-layer film carrier composed of a polyimide film having holes which extend therethrough and copper leads on a surface thereof, said process comprising the steps of:
   (1) providing a polyimide film having opposite first and second surfaces and a copper layer formed on a first surface thereof by additive plating,
   (2) forming a first photoresist layer on said copper layer and a second photoresist layer on said second surface of said polyimide film,
   (3) positioning a first mask adjacent said first photoresist layer and a second mask adjacent said second photoresist layer and passing light through said first and second masks to provide patterns in said first and second photoresist layers,
   (4) developing said first photoresist layer so as to remove portions thereof and bare selected areas of said copper layer,
   (5) providing copper leads on said selected areas of said copper layer by additive plating,
   (6) developing said second photoresist layer to remove portions thereof and bare selected areas of said second surface of said polyimide film,
   (7) postbaking remaining portions of said second photoresist layer,
   (8) removing remaining portions of said first photoresist layer and etching away the underlying copper layer,
   (9) etching said exposed areas of said second surface of said polyimide film so as to form holes through said polyimide film, and
   (10) removing said remaining portions of said second photoresist layer to thereby provide said two-layer film carrier.

2. A process as set forth in claim 1, wherein said copper leads formed by additive plating in step (4) are further electroplated with copper.

3. A process as set forth in claim 1, wherein said first photoresist layer on said copper layer is formed in step (2) by covering said copper layer with an alkali-developable negative photoresist solution having a viscosity of at least 40 cp and a solid content of at least 20% and prebaking it, while said second photoresist layer on said polyimide film is formed by covering said film with a photoresist of the rubber series and prebaking it.

4. A process as set forth in claim 3, wherein said thickness of said first photoresist layer on said copper layer is at least 30 microns, while said second thickness of said photoresist layer on said polyimide film is from 2 to 10 microns.

5. A process as set forth in claim 1, wherein said first photoresist layer developed in step (3) is further subjected to postbaking at a temperature of lower than 130° C. for a period of 10 to 90 minutes so as to expose selected portions of said copper layer.

6. A process as set forth in claim 1, further including the step of:
   (10) providing said leads with a surface finish by plating.

* * * * *